United States Patent [19]
Mydill

[11] Patent Number: 5,471,145
[45] Date of Patent: Nov. 28, 1995

[54] CALIBRATING TRANSITION DEPENDENT TIMING ERRORS IN AUTOMATIC TEST EQUIPMENT USING A PRECISE PULSE WIDTH GENERATOR

[75] Inventor: Marc R. Mydill, Garland, Tex.

[73] Assignee: Texas Instruments Incorporated, Dallas, Tex.

[21] Appl. No.: 224,225

[22] Filed: Apr. 7, 1994

[51] Int. Cl.⁶ ................................................. G04F 10/00
[52] U.S. Cl. ........................... 324/601; 324/617; 324/532
[58] Field of Search ..................................... 324/532, 533, 324/601, 606, 617; 73/1 R, 5

[56] References Cited

U.S. PATENT DOCUMENTS

| | | | |
|---|---|---|---|
| 4,627,268 | 12/1986 | Chu | 73/5 |
| 4,812,764 | 3/1989 | Bendall | 324/318 |
| 4,814,689 | 3/1989 | Obara | 324/601 |
| 5,047,725 | 9/1991 | Strid et al. | 324/601 |
| 5,382,910 | 1/1995 | Walsh | 324/533 |
| 5,384,541 | 1/1995 | Chu et al. | 324/617 |

*Primary Examiner*—Kenneth A. Wieder
*Assistant Examiner*—Glenn W. Brown
*Attorney, Agent, or Firm*—W. Daniel Swayze, Jr.; W. James Brady, III; Richard L. Donaldson

[57] ABSTRACT

A calibration method and system for substantially reducing one of the components of timing error in automatic test systems. The timing associated with digital stimulus and response circuitry in a tester is different for positive and negative signal transitions. This inherent timing difference is normally measured and compensated for during the tester calibration process. The present method and system uses a short circuited transmission line as a pulse generator to achieve superior stability and accuracy when calibrating transition dependent timing in automatic test systems.

5 Claims, 2 Drawing Sheets

CALIBRATING TRANSITION DEPENDENT TIMING ERRORS IN AUTOMATIC TEST EQUIPMENT USING A PRECISE PULSE WIDTH GENERATOR

BACKGROUND OF THE INVENTION

1. Field of the Invention

This invention relates to a system and method to compensate for the difference in timing for positive and negative signal transitions, particularly for use in conjunction with automatic test equipment.

2. Brief Description of the Prior Art

Semiconductor testers are collections of circuits which generate various waveforms designed to stimulate a semiconductor device under test (DUT) so that the outputs of the DUT for the various stimuli can be measured. The stimuli and measurement references have timing associated therewith which must be very precise.

The total timing accuracy of automatic test equipment is determined by the ability of calibration procedures to compensate for timing errors that cannot be corrected or avoided in the inherent design or manufacturing process. The total system timing error is comprised of different error components from various error sources in the equipment. This timing error determines the accuracy to which the tester is capable of generating digital inputs to the device under test (DUT) and the accuracy to which the tester is able to monitor the digital response of the DUT. Tester calibration procedures are designed to isolate and measure each error component. During actual device testing, these error measurements are used to adjust programmed timing values to compensate for the error sources.

Adequate functional testing of digital devices at specified performance limits generally requires the tester timing accuracy to be within 2% of the rate of operation of the DUT. As the rate of operation of devices increases, the timing accuracy of the tester becomes a larger percentage of the cycle time. Tester timing accuracy has traditionally struggled to keep pace with device performance, resulting in testing compromises or increasingly more complex test procedures.

One of the timing error sources in a tester is associated with the positive and negative signal transitions through the digital stimulus and response measurement circuitry. For example, if the tester is programmed to provide a digital pulse as an input to the DUT, the programmed width of the pulse will be in error due to differences in positive and negative transition timing of the signal generator. Similarly, if the tester measures a digital pulse response of a DUT, the measurement of the pulse will be in error due to differences in the manner of measurement circuitry response to positive and negative transitions. The tester calibration procedure must measure the differences between positive and negative signal generator outputs and measurement circuit response thereto. The accuracy to which the tester can measure this error determines the resulting contribution of this error source to the total timing error of the system.

One method of reducing this timing error component is to adjust or "trim" the stimulus and measurement circuitry as a manufacturing process step. The advantage of this method is that the error source is measured and compensated for once during manufacturing and does not require inclusion in the periodic tester calibration process. There are two key disadvantages to this method. First, this method is usually a manual adjustment and, therefore, not only adds to manufacturing cost, but also introduces the possibility of human error. Second and more important, if the parameters of the stimulus/response circuitry change with time, temperature or damage, the resulting timing error may be significantly greater since it is not practical to readjust the compensation to take such changes into account.

Most other methods of reducing this timing error component involve a periodic calibration process that uses calibration references to measure the error. The accuracy of the measurement is determined by the accuracy of the calibration references used. The calibration process usually involves one of several variations of the following basic process:

1. Generating a reference signal with a known timing relationship between a positive and negative transition using a reference signal generator.

2. Measuring the positive and negative transitions of the signal with the response measurement circuitry of the tester (on the tester channel being calibrated).

3. Determining the difference between the known timing relationship of the reference positive and negative transitions and the measured positive and negative transitions. This represents the transition dependent error of the response measurement circuitry.

4. Generating a signal with an assumed timing relationship between a positive and negative transition using the digital stimulus generator of the tester channel being calibrated.

5. Measuring the positive and negative transitions using either a calibrated tester response measurement circuit or a reference response measurement circuit.

6. Determining the difference between the assumed timing relationship of the positive and negative transitions of the signal and the timing relationship actually measured with the calibrated response measurement circuit or reference response measurement circuit. This represents the transition dependent error of the digital stimulus generator circuitry.

The accuracy of these measurements and therefore the resulting capability of the calibration process to reduce the transition dependent errors is directly affected by the accuracy and stability of the reference signal generator and/or reference response measurement circuit. Typical configurations for reference circuits are generally solid state electronic circuits that are characterized and adjusted as a manufacturing procedure to provide accurate performance. The problems with present calibration methods using the above described types of calibration references are:

1. The characteristics and performance of the references can change with time and environmental conditions, thus affecting the stability of the references.

2. The actual characterization and adjustment of the references introduces error.

SUMMARY OF THE INVENTION

In accordance with the present invention, the above noted problems of the prior art are minimized and there is provided a pulse width generator providing a very precise pulse width.

The above is accomplished by using a transmission line which has been short circuited to ground at one end thereof as a reference pulse generator for calibrating transition dependent timing errors. The advantages of this procedure over the prior art are:

1. The transmission line characteristics are much more stable over time and environmental extremes than electronic references.

2. The critical performance characteristics of transmission lines are easier to control during manufacturing and, accordingly, provide higher levels of precision than do electronic references.

Because of the inherent stability and ease of precision manufacturing, a transition dependent timing error calibration method using a short circuited transmission line to produce a reference signal results in more accurate and stable error measurements than are obtainable: by the prior art, thus improving the overall timing accuracy of a test system beyond that which is achievable with traditional procedures.

Briefly, a reference pulse is first generated by launching, for example, a positive transition from a reference driver onto the short circuited transmission line 21. The reflection of this pulse is then measured with a reference receiver and time measurement unit. The difference between the time measurement unit measurement and the known pulse width of the short circuited transmission line represents the reference receiver and time measurement unit transition-dependent error. The reference receiver is then connected to all tester digital stimulus circuits (one at a time) and the difference between an assumed pulse width generated by the stimulus circuitry and the pulse width measured by the reference receiver and time measurement unit can be used to obtain the transition dependent error associated with each digital stimulus circuit.

BRIEF DESCRIPTION OF THE DRAWINGS

FIGS. 3b and 3c are a set of waveforms associated with the short circuited transmission line pulse generator of FIGS. 2 and 3a.

DESCRIPTION OF THE PREFERRED EMBODIMENT

Figure 1:
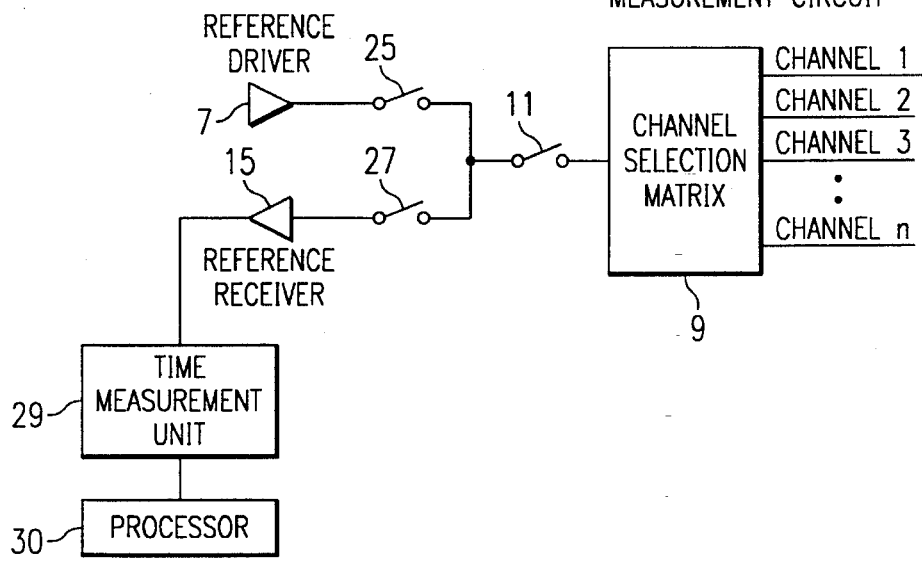
FIG. 1 is a schematic diagram of a typical prior art calibration reference configuration.

FIG. 1 shows a typical prior art configuration for reference circuits, primarily for testing devices having high pin counts. These circuits are generally solid state electronic circuits that are characterized and adjusted as a manufacturing procedure to provide accurate performance.

The circuit of FIG. 1 is designed to test a device under test (DUT) 1. Generally, the: circuit includes some type of stimulus circuit denoted as digital stimulus circuit 3 and a response measurement circuit denoted as digital response measurement circuit 5, there being a separate stimulus circuit 3 and response measurement circuit. 5 for each pin of the DUT 1.

Prior to testing, the tester channels are calibrated using common timing references and a means of connecting each tester channel to the common timing references. FIG. 1 shows two common references, a reference driver 7 for providing a common reference signal and a reference receiver 15 connected to a time measurement unit 29 for providing a common reference to measure time difference of selected signals. FIG. 1 also shows a processor 30, for example, the tester controller, with access to the values of the measurements made by the time measurement unit 29, which is used to compare time measurement values. FIG. 1 also shows a switching matrix comprised of a channel selection matrix 9 and switches 25, 27, 11 and 13 for the purpose of selectively connecting the common references to the digital stimulus circuit 3 and digital response measurement circuit 5 associated with each tester channel. The digital stimulus circuit 3 and digital response measurement circuit 5 are standard circuits commonly referred to as "pin electronics". Using the type of configuration shown in FIG. 1, several types of calibration procedures can be performed for the purpose of aligning the timing associated with the pin electronics of each tester channel. For example, the reference driver 7 can be connected to the digital response measurement circuit 5 of a particular channel via the channel selection matrix 9 and switches, 25, 11 and 13. The reference driver 7 can then generate a reference signal and the timing of the digital response measurement circuit 5 can be adjusted so that the reference signal is correctly detected by the digital response measurement circuit 5. All other channels can be adjusted similarly using the common reference signal provided by the reference driver 7.

In another example, the reference receiver 15 and time measurement unit 29 can be connected to the digital stimulus circuit 3 of a particular channel via the channel selection matrix 9 and switches 27, 11 and 13. The timing of the digital stimulus circuit 3 can then be measured with the time measurement unit 29 and adjusted to be aligned to a common timing reference provided by the time measurement unit 29. All other channels can be adjusted similarly using the time measurement unit 29 as a common measurement reference, The actual details of calibration procedures using the present calibration methods can vary significantly, however common problems with the previously described types of calibration references with regard to positive and negative signal transitions are:

1. The characteristics and performance of the references can change with time and environmental conditions, thus affecting the stability of the references.

2. The actual characterization and adjustment of the references introduces error.

Figure 2:
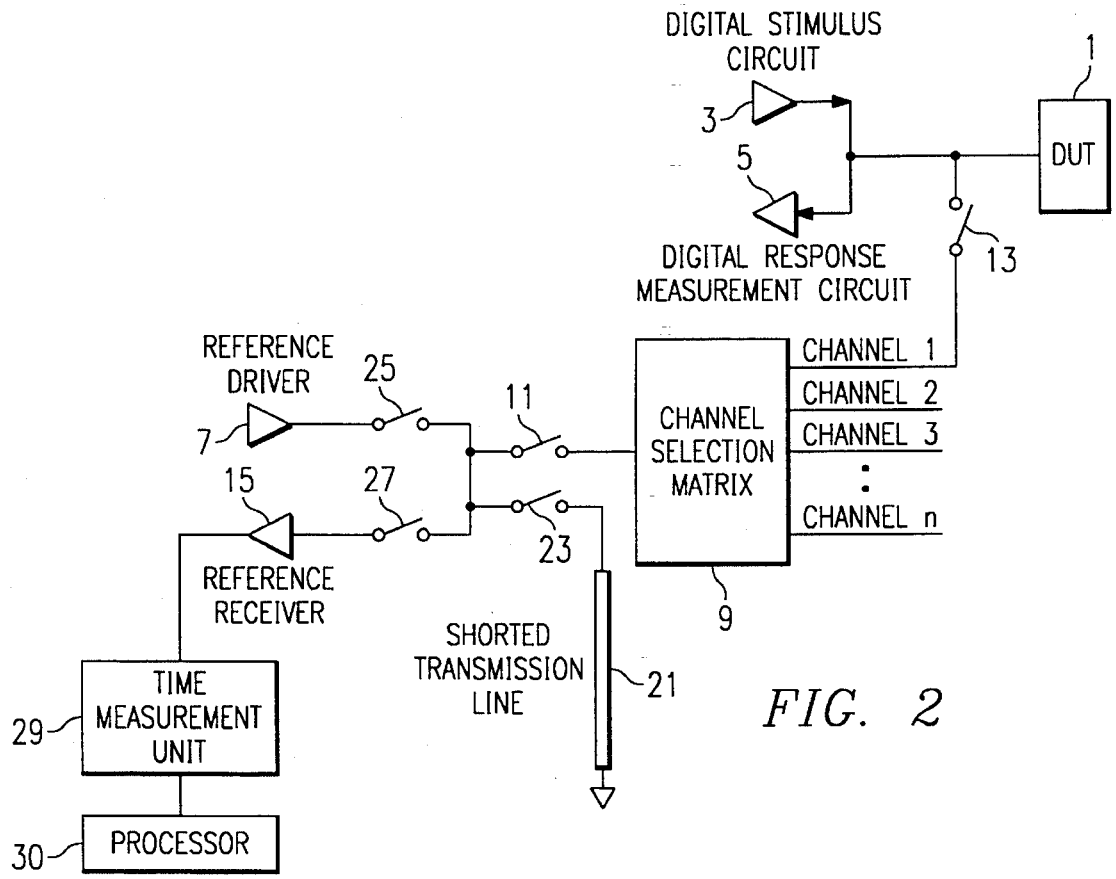
FIG. 2 is a schematic diagram of a calibration reference configuration in accordance with the present invention using a short circuited transmission line as a precision pulse generator.

Referring now to FIG. 2, there is shown a reference generator circuit for use in conjunction with the calibration techniques of the present invention. The reference generator is the same as the prior art as shown and described above with reference to FIG. 1 except for the addition of a short circuited transmission line 21 and a switch 23 connecting the transmission line 21 in the form, preferably, of a coaxial cable to the calibration circuit. The electrical delay of the transmission line 21 is preset and known very accurately as will be explained hereinbelow. Furthermore, transmission lines are very stable and do not change their delay with temperature or age. Advantage is taken of this fact in the alignment of the reference driver 7 and the reference receiver 15. This is accomplished by short circuiting one end of the transmission line 21 to reference potential or ground.

Figure 3A:
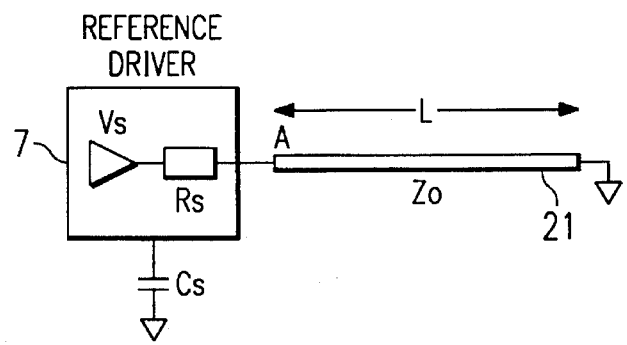
FIG. 3a is a schematic diagram of the short circuited transmission line of FIG. 2.
Figure 3B:
Figure 3C:
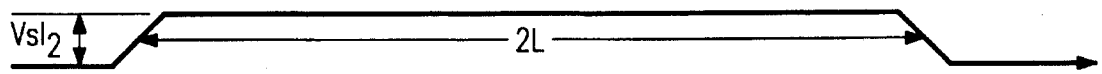

Referring now to FIG. 3b and 3c, there are shown the waveforms associated with the short circuited transmission line pulse generator as shown in greater detail in FIG. 3a. The reference driver circuit 7 launches, for example, a positive signal onto the transmission line 21 of amplitude $V_S$ as shown in FIG. 3b. The output impedance ($R_S$) of the reference driver 7 is adjusted to match the characteristic impedance ($Z_O$) of the transmission line, so the incident voltage on the transmission line is $V_S/2$. Since the end of the transmission line 21 is short circuited to ground, the reflection coefficient is −1 and the reflected voltage will equal $-V_S/2$. The total voltage will be the sum of the incident and reflected voltages or $V_S/2-V_S/2=0$. The incident voltage will propagate along the transmission line 21 and reach the end of the line at time T, where L is the electrical length of the transmission line. The reflected voltage will then propagate back toward the reference driver 7 and arrive at time 2L. Since $R_S=Z_O$, the reflection coefficient at this end of the line (A) is 0 and no further voltage reflections will occur. Therefore, the waveform observed at point A will be a pulse of amplitude $V_S/2$ and width of 2L as shown in FIG. 3c.

The advantage of generating a reference pulse width in this manner is that the electrical length of a transmission line 21 can be controlled to within very small tolerances with respect to the required transition-dependent error measurement accuracy. Typical manufacturing processes can achieve electrical tolerances of less than 1% of the electrical length. Therefore, by using a transmission line as short as possible, the pulse width error can be minimized. The minimum length of the transmission line 21 is determined by the transition time of the output of the reference driver 7. If Tr is the transition time of the reference driver output, then Tr must be greater than 2L. Furthermore, the electrical length of the transmission line (and therefore the reference pulse width) will remain constant over time and over a very wide range of environmental conditions.

In actual use of the short circuited transmission line 21, the small amount of capacitance $C_S$ at point A as shown in FIG. 3a must be accounted for. This capacitance will increase the pulse width by approximately $Z_O*C_S/2$. With proper circuit design techniques, this capacitance can be made to be small so that any variations in $C_S$ will produce negligible variations in the pulse width. Nevertheless, $C_S$ must be known and taken into account for maximum pulse width accuracy. The effect of $C_S$ can also be reduced by using a lower impedance transmission line.

The normal calibration process is similar to that described previously using the present calibration methods. The short circuited transmission line 21 is used to provide an improved method of reducing transition dependent timing errors inherent in the present calibration process. The process for measuring the transition dependent timing errors involves the following steps:

First, a reference pulse is generated by launching, for example, a positive transition from the reference driver 7 onto the short circuited transmission line 21 by closing the switches 25 and 23. The reflection of this pulse is then measured with the reference receiver 15 and time measurement unit 29 by closing the switch 27. The difference between the time measurement unit 29 measurement and the known pulse width of the short circuited transmission line 21 represents the reference receiver and time measurement unit transition-dependent error. The reference receiver 15 is then connected to all tester digital stimulus circuits 3 (one at a time) by closing switches 25 and 11 via channel selection matrix 9 and closure of a switch 13 for the selected channel and associated digital stimulus circuit 3 and the difference between an assumed pulse width generated by the stimulus circuitry 3 and the pulse width measured by the reference receiver 15 and time measurement unit 29. The reference receiver 15 and time measurement unit 29 transition-dependent error is used to compensate the pulse width measurements.

For example, if the short circuited transmission line 21 is designed to generate a reference pulse with a pulse width of 2 ns, and the reference receiver 15 and time measurement unit 29 measure the pulse to be 2.1 ns, then the reference receiver 15 and time measurement unit 29 would have a known transition dependent timing error of 2.1 ns−2.0 ns=0.1 ns. Then, if the reference receiver 15 and time measurement unit 29 measured the pulse width of a pulse generated by a particular digital stimulus circuit 3 to be, for example, 3.5 ns, the known transition dependent timing error of the reference receiver 15 and time measurement circuit 29 could be subtracted from the measured value to yield a more accurate value for the actual pulse width. In this example, the measurement error of 0.1 ns would be subtracted from the measurement value of 3.5 ns, indicating that the width of the pulse generated by the digital stimulus circuit 3 was actually 3.4 ns. Therefore, if, for example, the assumed pulse width of the digital stimulus circuit 3 was programmed to be 3 ns and the reference receiver 15 and time measurement unit 29 measured 3.5 ns, the transition dependent error associated with the digital stimulus circuit 3 would be 3.5 ns−3 ns.−0.1 ns=0.4 ns. This represents the transition-dependent timing error of the tester digital stimulus circuit 3.

At this point, one of two methods for measuring the transition-dependent timing error of each tester response measurement circuit 5 can be used.

According to the first method, each tester stimulus circuit 3 is connected to each tester response measurement circuit 5 (one at a time). A reference pulse is generated using the tester stimulus circuit 3. The transition-dependent timing error value previously measured is used to compensate for errors in the pulse width of this reference signal. Continuing with the prior example, if the known transition dependent error associated with a particular digital stimulus circuit 3 is 0.4 ns, and if this digital stimulus circuit is used as a reference to calibrate the transition dependent error of the corresponding response measurement circuit 5, then the transition dependent error of the digital stimulus circuit can be used to calculate the resulting transition dependent error of the response measurement circuit. For example, if the reference pulse produced by the digital stimulus circuit 3 is programmed to be 3.0 ns, the actual reference pulse will be 3.0 ns+ 0.4 ns=3.4 ns. Then, if the response measurement circuit 5 detects the reference pulse to have a width of 3.2 ns, the transition dependent error associated with the response measurement circuit is 3.2 ns−3.4 ns=−0.2 ns.

According to the second method, the reference driver 7 is connected to the reference receiver 15. A reference pulse is then generated by the reference driver 7 with an assumed pulse width using the reference driver. The reference pulse is measured by the reference receiver 15 and time measurement unit 29 with the transition-dependent timing error value of the reference receiver used to compensate the pulse width measurement. The difference between the assumed reference signal pulse width and the compensated pulse width measurement represents the transition-dependent timing error of the reference driver 7. The reference driver 7 is then connected to each tester digital response measurement circuit 5 (one at a time) and a reference pulse is generated using the reference driver 7. Since the transition dependent timing error of the reference driver is known, the reference pulse width detected by the digital response measurement circuit 5 can be compared to the assumed (or programmed) reference pulse width and known transition dependent timing error. This is similar to the previously described method using the digital stimulus circuit 3. Therefore, in general, the transition dependent timing error of the digital response measurement circuit 5 is obtained with the following calculation:

DRMe=DRMm−RPw−RPe, where:

DRMe=digital response measurement circuit transition dependent timing error,

DRMm=pulse width of reference signal detected by the digital response measurement circuit 5, RPw=programmed pulse width of reference pulse (generated by either the reference driver 7 or digital stimulus circuit 3), RPe=transition dependent error (associated with either the reference driver 7 or digital stimulus circuit 3).

The reference pulse is measured with the digital response measurement circuit 5 on each tester channel. The difference between the measured pulse width and the reference pulse width represents the transition-dependent timing error of each tester digital response measurement circuit 5.

The key advantage to this calibration process is that, even though electronic circuits are being used for the reference driver 7 and reference receiver 15, the associated transition-dependent timing errors are re-measured each time the reference circuits 7 and 15 are used for calibration. The error measurements are based upon a very precise and stable pulse width generator (the short circuited transmission line 21), so any changes in the characteristics of the electronic reference circuits will be reflected in the updated error measurements.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A method of calibrating transition dependent equipment timing errors, comprising the steps of:

generating an incident signal onto a short circuited transmission line to ground;

measuring a time difference measurement between said incident signal and a reflection of said incident signal resulting from generation of said reference signal onto said short circuited transmission line;

determining the difference between said time difference measurement and a known pulse width of said short circuited transmission line to provide an indication of the transition-dependent error of said time difference measurement; and compensating subsequent pulse width measurements in response to said indicating the transition-dependent error.

2. A system for calibrating transition dependent equipment timing errors comprising:

a short circuited transmission line to ground and having a known length;

an incident signal source for generating and reflecting an incident signal onto said short circuited transmission line;

a time measurement reference unit for measuring a time difference between said incident signal and said reflection of said incident signal resulting from said generation of said incident signal onto said short circuited transmission line to said ground;

circuitry to disconnect said short circuited transmission line from said time measurement reference unit; and circuitry to connect another signal source to said time measurement reference unit to achieve said calibration.

3. The system of claim 2 wherein said time measurement reference unit includes means to compare said known length to said time difference to determine the reference transition dependent error of said time measurement reference unit.

4. The system of claim 3 wherein said time measurement reference unit further includes means for measuring transition dependent errors of said other signal source.

5. The system of claim 4 wherein said system further includes means for correcting said transition dependent errors of said other signal source in response to said reference transition dependent error of said time measurement reference unit.

* * * * *